(12) United States Patent
Li et al.

(10) Patent No.: US 7,557,370 B2
(45) Date of Patent: *Jul. 7, 2009

(54) HETEROACENE POLYMERS AND ELECTRONIC DEVICES GENERATED THEREFROM

(75) Inventors: Yuning Li, Mississauga (CA); Beng S. Ong, Mississauga (CA); Yiliang Wu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 461 days.

This patent is subject to a terminal disclaimer.

(21) Appl. No.: 11/399,064

(22) Filed: Apr. 6, 2006

(65) Prior Publication Data

US 2007/0235722 A1    Oct. 11, 2007

(51) Int. Cl.
*H01L 35/24* (2006.01)
*H01L 51/00* (2006.01)
(52) U.S. Cl. ............................... 257/40; 257/E51.001
(58) Field of Classification Search ................ 257/40
See application file for complete search history.

(56) References Cited

U.S. PATENT DOCUMENTS 5,619,357 A    4/1997    Angelopoulos et al.

(Continued)

FOREIGN PATENT DOCUMENTS

| JP | 10340786 A | * | 12/1998 |
| JP | 2005206750 A | * | 8/2005 |

OTHER PUBLICATIONS

Schmidt et al, "Highly soluble acenes as semiconductors for thin film transistors," Journal of Materials Chemistry, 2006, 16, 3708-3714.*

Pan et al, "Synthesis and Thin-Film Transistor Performance of Poly(4,8-didodecylbenzo[1,2-b:4,5-b']dithiophene)," Chem. Mater., 2006, 18, 3237-3241.*

(Continued)

*Primary Examiner*—Jerome Jackson, Jr.
*Assistant Examiner*—Anthony Ho
(74) *Attorney, Agent, or Firm*—Eugene O. Palazzo; Fay Sharpe LLP

(57) ABSTRACT

An electronic device comprising a semiconductive material of Formula or structure (I)

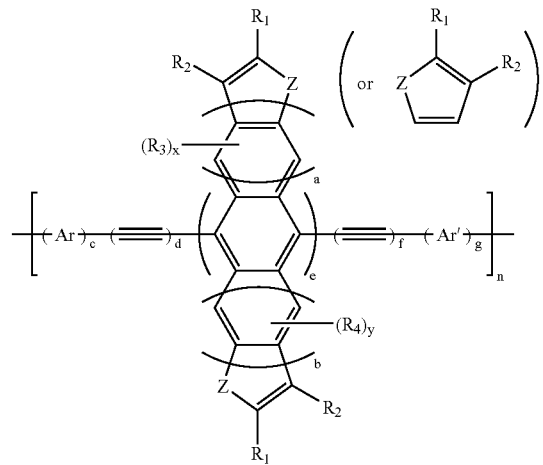

wherein each $R_1$, $R_2$, $R_3$ and $R_4$ are independently hydrogen (H), a heteroatom containing group, a suitable hydrocarbon, or a halogen; Ar and Ar' each independently represents an aromatic moiety; x, y, a, b, c, d, e, f and g represent the number of groups or rings, respectively; Z represents sulfur, oxygen, selenium, or NR''' wherein R''' is hydrogen, alkyl, or aryl; and n represents the number of repeating units.

36 Claims, 2 Drawing Sheets

U.S. PATENT DOCUMENTS

| | | | |
|---|---|---|---|
| 5,777,070 | A | 7/1998 | Inbasekaran et al. |
| 5,936,259 | A * | 8/1999 | Katz et al. ................... 257/40 |
| 5,969,376 | A | 10/1999 | Bao |
| 6,107,117 | A | 8/2000 | Bao et al. |
| 6,150,191 | A | 11/2000 | Bao |
| 6,770,904 | B2 | 8/2004 | Ong et al. |
| 7,372,071 | B2 * | 5/2008 | Li et al. ........................ 257/40 |
| 2003/0102471 | A1 * | 6/2003 | Kelley et al. ................. 257/40 |
| 2003/0209692 | A1 * | 11/2003 | Farrand et al. ......... 252/299.61 |
| 2005/0017311 | A1 | 1/2005 | Ong et al. |
| 2007/0102696 | A1 * | 5/2007 | Brown et al. .................. 257/40 |

OTHER PUBLICATIONS

Kuo et al, "TES Anthradithiophene Solution-Processed OTFTs with 1 cm2/V-s Mobility," IEDM, 2004, 04, 373-376.*

Payne et al, "Organic Field-Effect Transistors from Solution-Deposited Functionalized Acenes with Mobilities as High as 1cm2/V-s," J. Am. Chem. Soc., 2005, 127, 4986-4987.*

Payne et al, "Stable, Crystalline Acenedithiophenes with up to Seven Linearly Fused Rings," Organic Letters, 2004, vol. 6, No. 19, 3325-3328.*

Machine Translation of JP 10-340786.*

Machine Translation of JP 2005-206750.*

Ong, Beng, et al., U.S. Appl. No. 11/011,678, filed Dec. 14, 2004 on Compound with Indolocarbazole Moieties and Devices Containing Such Compound.

Ong, Beng, et al., U.S. Appl. No. 11/167,512, filed Jun. 27, 2005 on Compound with Indolocarbazole Moieties and Devices Containing Such Compound.

Huang, D.H., et al., "Conjugated Polymers Based on Phenothiazine and Fluorene in Light-Emitting Diodes and Field Effect Transistors", *Chem. Mater. 2004*, 16, 1298-1303.

Zhu, Y., et al, "Phenoxazine-Based Conjugated Polymers: A New Class of Organic Semiconductors for Field-Effect Transistors", *Macromolecules 2005*, 38, 7983-7991.

* cited by examiner

HETEROACENE POLYMERS AND ELECTRONIC DEVICES GENERATED THEREFROM

STATEMENT REGARDING FEDERALLY SPONSORED RESEARCH OR DEVELOPMENT

The electronic devices and certain components thereof were supported by a United States Government Cooperative Agreement No. 70NANBOH3033 awarded by the National Institute of Standards and Technology (NIST). The United States Government has certain rights relating to the devices and certain semiconductor components illustrated hereinafter.

CROSS REFERENCE TO RELATED APPLICATIONS

U.S. Pat. No. 7,372,071, filed Apr. 6, 2006, on Functionalized Heteroacenes and Electronic Devices Generated Therefrom, by Yuning Li et al.

U.S. application Ser. No. 11/399,226, filed Apr. 6, 2006, on Functionalized Heteroacenes, by Yuning Li et al.

U.S. application Ser. No. 11/399,169, filed Apr. 6, 2006, on Ethynylene Acene Polymers and Electronic Devices Generated Therefrom, by Yuning Li et al.

U.S. application Ser. No. 11/399,091226, filed Apr. 6, 2006, on Ethynylene Acene Polymers, by Yuning Li et al.

U.S Pat. No. 7,449,715, filed Apr. 6, 2006, on Poly[bis (ethynyl)heteroacenes] and Electronic Devices Generated Therefrom, by Yuning Li et al.

U.S. application Ser. No. 11/399,141, filed Apr. 6, 2006, on Semiconductors and Electronic Devices Generated Therefrom, by Yiliang Wu et al.

U.S. application Ser. No. 11/399,230, filed Apr. 6, 2006, on Semiconductor Polymers, by Yiliang Wu et al.

U.S. application Ser. No. 11/398,941, filed Apr. 6, 2006, on Polydiazaacenes and Electronic Devices Generated Therefrom, by Yiliang Wu et al.

U.S. application Ser. No. 11/398,902, filed Apr. 6, 2006, on Polydiazaacenes, by Yiliang Wu et al.

U.S. application Ser. No. 11/398,931, filed Apr. 6, 2006, on Poly(alkynylthiophene)s and Electronic Devices Generated Therefrom, by Beng S. Ong et al.

U.S. application Ser. No. 11/399,246, filed Apr. 6, 2006, on Poly(alkynylthiophene)s, by Beng S. Ong et al.

U.S. application Ser. No. 11/399,092, filed Apr. 6, 2006, on Linked Arylamine Polymers and Electronic Devices Generated Therefrom, by Yuning Li et al.

U.S. application Ser. No. 11/399,065, filed Apr. 6, 2006, on Linked Arylamine Polymers, by Yuning Li et al.

Illustrated in U.S. application Ser. No. 11/011,678 filed Dec. 14, 2004 relating to indolocarbazole moieties and thin film transistor devices thereof.

Illustrated in U.S. application Ser. No. 11/167,512 filed Jun. 27, 2005 relating to indolocarbazole moieties and thin film transistor devices thereof.

Illustrated in U.S. Pat. No. 6,770,904 and co-pending application U.S. application Ser. No. 10/922,662, Publication No. 20050017311, are electronic devices, such as thin film transistors containing semiconductor layers of, for example, polythiophenes.

The disclosure of each of the above cross referenced applications and patent is totally incorporated herein by reference. In aspects of the present disclosure, there may be selected the appropriate substituents, such as a suitable hydrocarbon, a heteroatom containing group, hydrogen, halogen, CN, $NO_2$, rings, number of repeating polymer units, number of groups, and the like as illustrated in the copending applications.

The appropriate components, processes thereof and uses thereof illustrated in these copending applications and patent may be selected for the present invention in embodiments thereof.

BACKGROUND

The present disclosure is generally directed to heteroacene polymers and uses thereof. More specifically, the present disclosure in embodiments is directed to ethynylene heteroacene polymers selected as solution processable and substantially stable channel semiconductors in organic electronic devices, such as thin film transistors.

There are desired electronic devices, such as thin film transistors, TFTs, fabricated with novel polymers like ethynylene heteroacenes, with excellent solvent solubility, and which can be solution processable; and devices thereof with mechanical durability and structural flexibility, desirable for fabricating flexible TFTs on plastic substrates. Flexible TFTs could enable the design of electronic devices with structural flexibility and mechanical durability characteristics. The use of plastic substrates together with the novel polymers like the ethynylene heteroacene polymers can transform the traditionally rigid silicon TFT into a mechanically more durable and structurally flexible TFT design. This may be of value to large area devices, such as large-area image sensors, electronic paper and other display media. Also, the selection of ethynylene heteroacene polymers TFTs for integrated circuit logic elements for low end microelectronics, such as smart cards, radio frequency identification (RFID) tags, and memory/storage devices, may enhance their mechanical durability, and thus increase their useful life span.

A number of semiconductor materials are not, it is believed, stable when exposed to air as they become oxidatively doped by ambient oxygen, resulting in increased conductivity. The result is large off-current and thus low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

Additionally, TFTs fabricated from ethynylene heteroacene polymers may be functionally and structurally more desirable than conventional silicon technology in that they offer mechanical durability, structural flexibility, and the potential of being able to be incorporated directly onto the active media of the devices, thus enhancing device compactness for transportability.

REFERENCES

Heteroacenes and acenes, like pentacene, are known to possess acceptable high filed effect mobility when used as channel semiconductors in TFTs. However, these compounds are rapidly oxidized by, for example, atmospheric oxygen under light and such compounds are not considered processable at ambient conditions. Furthermore, heteroacenes when selected for TFTs possess, it is believed, poor thin film formation characteristics and are insoluble, or have minimal solubility in a number of common solvents rendering these compounds as being nonsolution processing; accordingly, such compounds have been processed by vacuum deposition methods resulting in high production costs, eliminated or minimized with the TFTs generated with the functionalized heteroacenes illustrated herein.

A number of organic semiconductor materials has been described for use in field effect TFTs, which materials include organic small molecules such as pentacene, see for example D. J. Gundlach et al., "Pentacene organic thin film transistors—molecular ordering and mobility", *IEEE Electron Device Lett.*, Vol. 18, p. 87 (1997); oligomers, such as sexithiophenes or their variants, see for example reference F. Garnier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p 4108 (1996). Although organic material based TFTs generally provide lower performance characteristics than their conventional silicon counterparts, such as silicon crystal or polysilicon TFTs, they may nonetheless be sufficiently useful for applications in areas where high mobility is not required.

Illustrated in Huang, D. H., et al, *Chem. Mater.* 2004, 16, 1298-1303, are, for example, LEDs and field effect transistors based on certain phenothiaazines like poly(10-(2-ethylhexyl) phenothiaazine).

Illustrated in Zhu, Y., et al, *Macromolecules* 2005, 38, 7983-7991, are, for example, semiconductors based on phenoxazine conjugated polymers like poly(10-hexylphenoxazine).

Vacuum deposition may also involve the difficulty of achieving consistent thin film quality for large area format. Polymer TFTs, such as those fabricated from regioregular components, of, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, TFTs generated with poly(3-alkylthiophene-2,5-diyl) are sensitive to air. The TFTs fabricated from these materials in ambient conditions generally exhibit large off-current, low current on/off ratios, and their performance characteristics degrade rapidly.

Additional references that may be of interest include U.S. Pat. Nos. 6,150,191; 6,107,117; 5,969,376; 5,619,357, and 5,777,070.

BRIEF DESCRIPTION OF THE DRAWINGS

Illustrated in FIGS. 1 to 4 are various representative embodiments of the present disclosure, and wherein ethynylene heteroacenes are selected as the channel or semiconductor material in thin film transistor (TFT) configurations.

DESCRIPTION OF THE EXEMPLARY EMBODIMENTS

Figure 1:
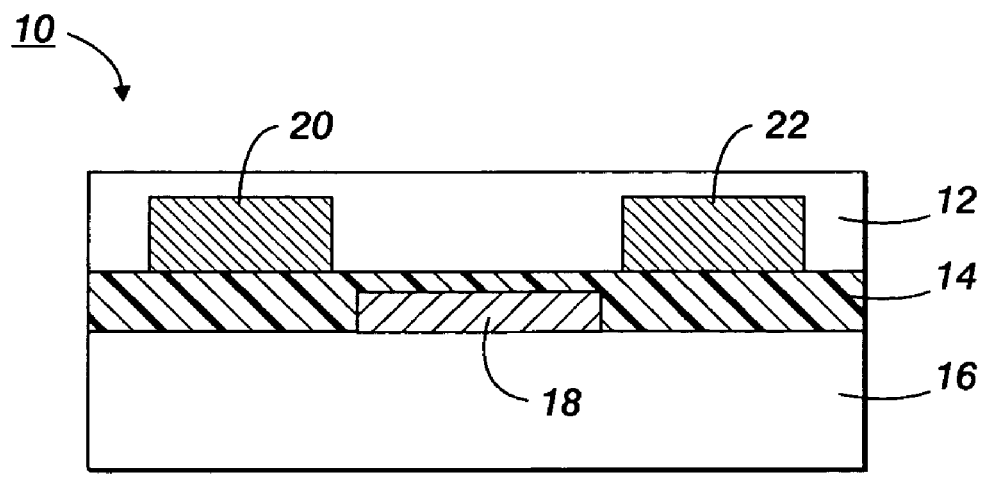

Aspects of the present disclosure relate to semiconductor ethynylene heteroacenes, such as those of the Formulas, and which are useful as a component of an electronic device, such as a thin film transistor.

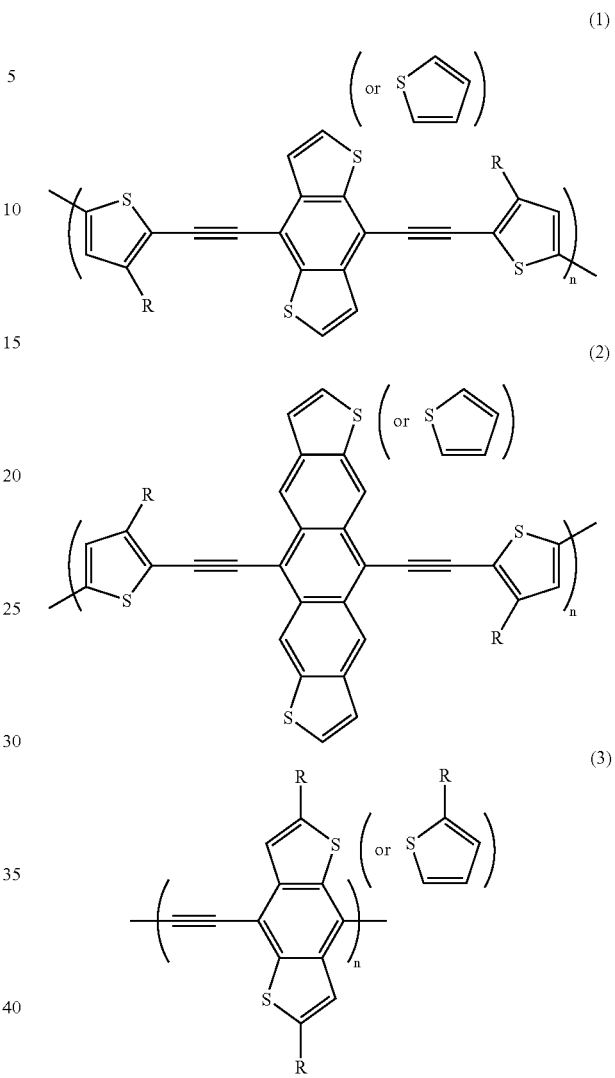

wherein R is an alkyl of, for example, butyl, pentyl, hexyl, heptyl, octyl, nonyl, decyl, undecyl, dodecyl, tridecyl, tetradecyl, pentadecyl, hexadecyl, heptadecyl, octadecyl; an aryl of, for example, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl; an alkoxy of, for example, butyloxy, pentyloxy, hexyloxy, heptyloxy, ocyloxy, nonyloxy, decyloxy, undecyloxy, dodecyloxy, tridecyloxy, tetradecyloxy, pentadecyloxy, hexadecyloxy, heptadecyloxy, octadecyloxy, nonadecyloxy, or eicosanyloxy; and wherein n is the number of repeating units in the polymer of, for example, from about 2 to about 5,000.

In yet other aspects, there are provided ethynylene heteroacene polymers with a band gap of from about 1.5 eV to about 3 eV as determined from the absorption spectra of thin films thereof, and which ethynylene heteroacene polymers are suitable for use as TFT semiconductor channel layer materials; ethynylene heteroacene polymers, which are useful as microelectronic components, and which ethynylene heteroacenes possess solubility of, for example, at least about 0.1 percent to about 95 percent by weight in organic solvents, such as methylene chloride, tetrahydrofuran, toluene, xylene, mesitylene, chlorobenzene, and the like; and thus these components can be economically fabricated by solution processes, such as spin coating, screen printing, stamp printing, dip coating, solution casting, jet printing, and the like; electronic devices, such as TFTs, with an ethynylene heteroacene channel layer, and which layer has a conductivity of from about $10^{-4}$ to about $10^{-9}$ S/cm (Siemens/centimeter); novel ethynylene heteroacene polymers and devices thereof, and which devices exhibit enhanced resistance to the adverse effects of oxygen, that is, these devices exhibit relatively high current on/off ratios, and their performance does not substantially degrade as rapidly as similar devices fabricated with regioregular poly(3-alkylthiophene-3,5-diyl) or with heteroacenes; a class of novel ethynylene heteroacene polymers with unique structural features which allow molecular self-alignment under appropriate processing conditions, and which structural features also enhance the stability of device performance; and proper molecular alignment can permit higher molecular structural order in thin films, which can be important to efficient charge carrier transport, thus higher electrical performance.

There are disclosed in embodiments novel polymers and electronic devices thereof. More specifically, the present disclosure relates to ethynylene heteroacene polymers illustrated by or encompassed by Formula or structure (I)

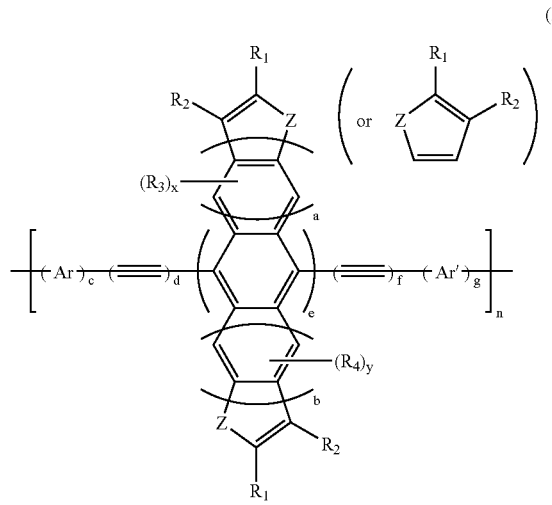

wherein each $R_1$, $R_2$, $R_3$ and $R_4$ are independently hydrogen (H), a heteroatom containing group, or a halogen; a suitable hydrocarbon, or a halogen; Ar and Ar' each independently represents an aromatic moiety; x, y, a, b, c, d, e, f and g represent the number of groups or rings, respectively; Z represents sulfur, oxygen, selenium, or NR''' wherein R''' is hydrogen, alkyl, or aryl; and n represents the number of repeating units. In embodiments, Ar and Ar' are aromatic moieties, independently selected from the group consisting of the following structural units which are optionally substituted

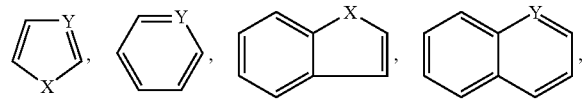

-continued

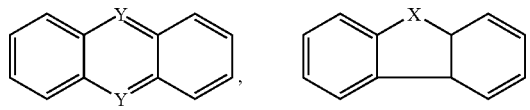

and wherein X is selected from the group consisting of C(R'R''), O, S, Se, NR, and Si(R'R''), and wherein R, R', and R'' are independently selected from the group consisting of hydrogen, a suitable hydrocarbon, a suitable hydrocarbon group, such as alkyl with 1 to about 24 carbon atoms, aryl with about 6 to about 48 carbon atoms; and Y is a carbon atom or a nitrogen atom.

In embodiments, $R_1$ and $R_2$ are independently selected from hydrogen, a suitable hydrocarbon group, such as alkyl, aryl, and the like, a heteroatom like selenium containing group, or a halogen, or mixtures thereof; $R_3$ is selected from the group consisting of an optionally unsubstituted or substituted hydrocarbon group, a heteroatom containing group, a halogen, or mixtures thereof; x represents the number of groups and can be from zero to about 12; when x is more than 1, a and b each represent the number of fused ring moieties and can be, for example, from zero to about 4, and more specifically, wherein each a and b are from about zero to about 2; c represents the number of the aromatic units, Ar; and can be, for example, from zero to about 10, and more specifically, from zero to about 6; d represents the number of heteroacene moieties and can be, for example, from about 1 to about 10, and more specifically, from about 1 to about 4; e and f each independently represent the number of ethynyl groups (triple bond) and can be from zero to about 4, and more specifically, from zero to about 2; g represents the number of the aromatic units, Ar', and can be, for example, from zero to about 10, and more specifically, from zero to about 6; n represents the number of repeating units, such as for example, and n is a number of from about 2 to about 5,000, and more specifically, from about 2 to about 1,000 or from about 5 to about 500. The sum of a and b can be, for example, from zero to about 6; the sum of c and f can be, for example, from zero to about 20, and more specifically, from zero to about 10; the sum of d and e can be, for example, from 1 to about 4.

Suitable hydrocarbons are known and include, for example, alkyl, aryl, substituted alkyl, substituted aryl, alkylaryl, alkoxy, and the like.

In embodiments, a specific class of ethynylene heteroacene polymers are represented by the following formulas:

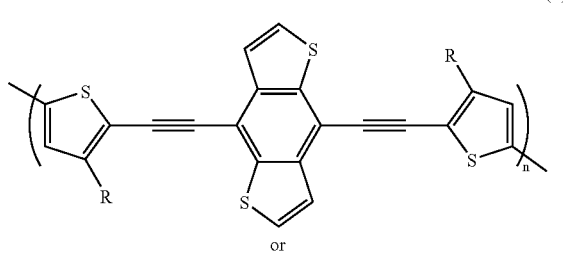

or

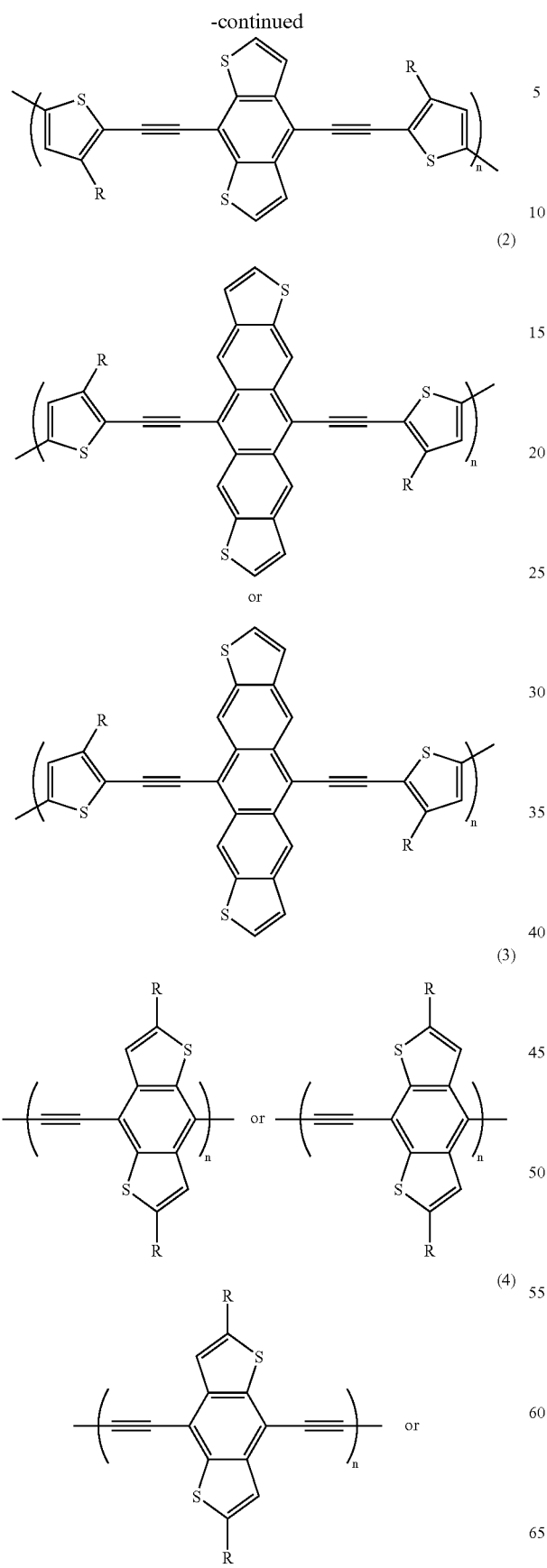
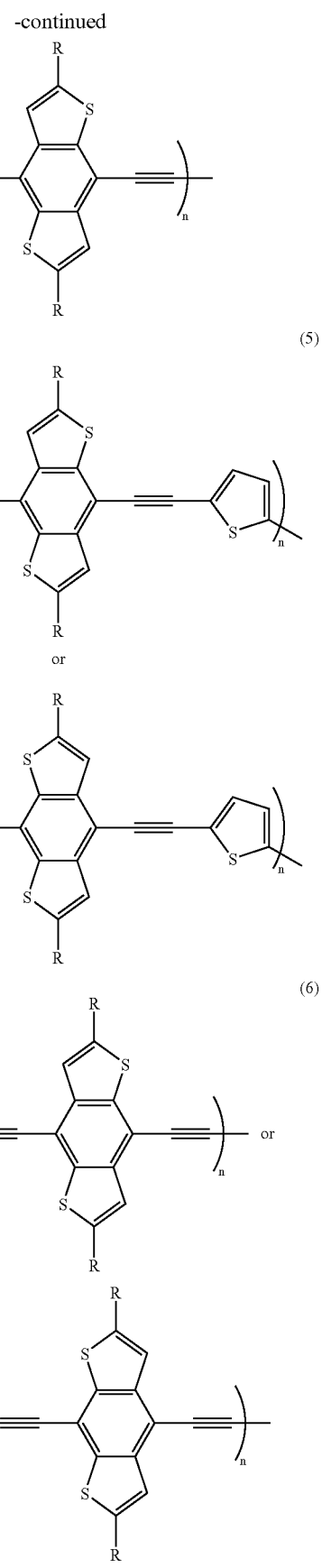

-continued
(7)
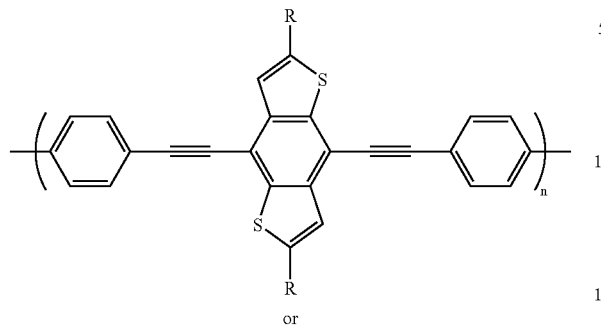
(8)
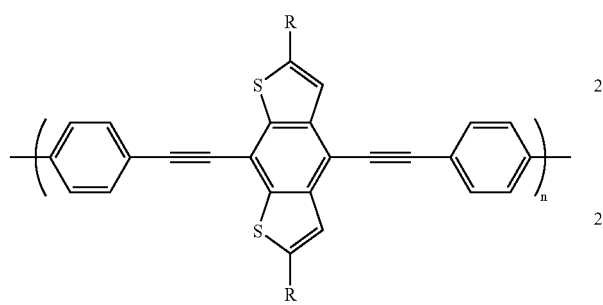
(9)
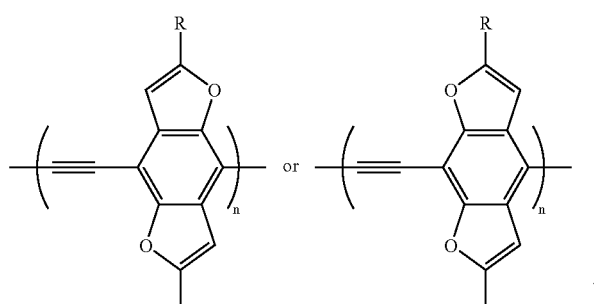
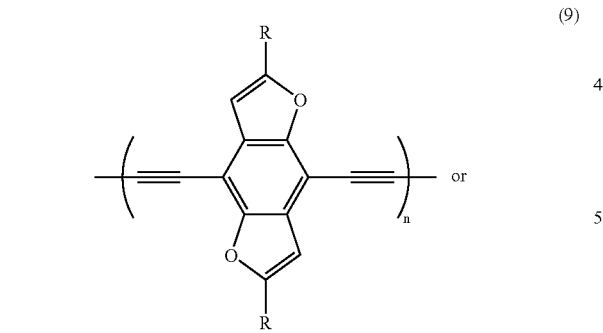
-continued
(10)
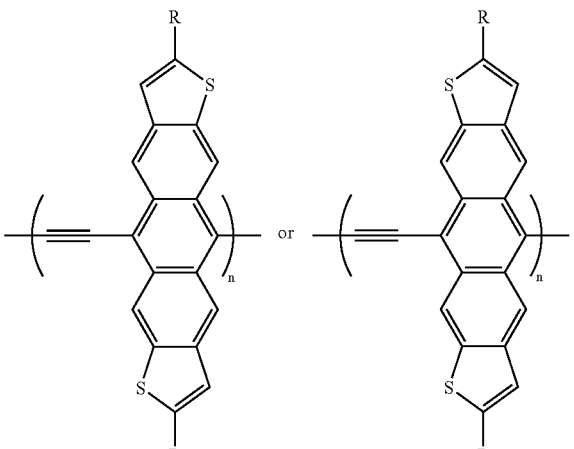
(11)
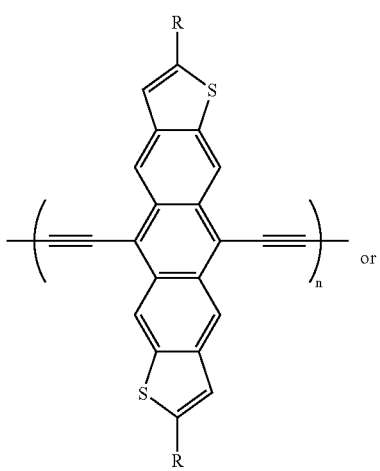
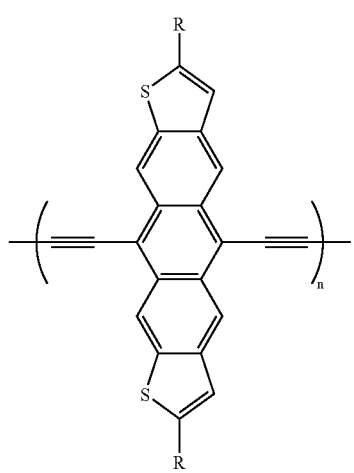

-continued

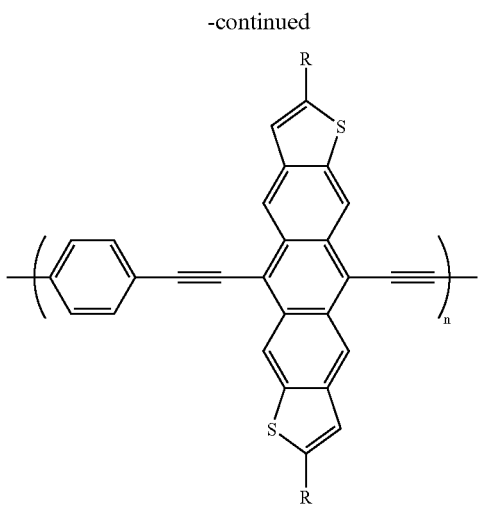

(12)

or

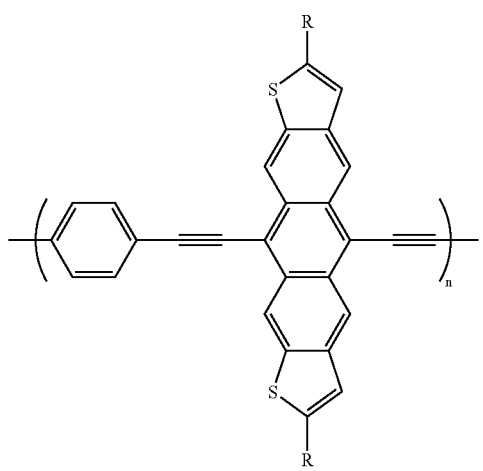

wherein R is butyl, pentyl, hexyl, heptyl, octyl, nonyl, decyl, undecyl, dodecyl, tridecyl, tetradecyl, pentadecyl, hexadecyl, heptadecyl, octadecyl; butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl; an alkoxy of butyloxy, pentyloxy, hexyloxy, heptyloxy, ocyloxy, nonyloxy, decyloxy, undecyloxy, dodecytoxy, tridecyloxy, tetradecyloxy, pentadecyloxy, hexadecyloxy, heptadecyloxy, octadecyloxy, nonadecyloxy, or eicosanyloxy; and wherein n is the number of repeating units in the polymer, n being from about 10 to about 200 or from about 2 to about 100; and wherein the two five-membered heteroaromatic moieties are in the trans position or the cis position.

Examples of $R_1$ to $R_4$ and R include alkyl with, for example, from about 1 to about 30, including from about 4 to about 18 carbon atoms (included throughout are numbers within the range, for example 4, 5, 6, 7, 8, 9, 10, 11, 12, 13, 14, 15, 16, 17 and 18), and further including from about 6 to about 16 carbon atoms, such as butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, isomeric forms thereof, mixtures thereof, and the like; alkoxy with, for example, from about 1 to about 24 carbon atoms, and more specifically, from about 4 to about 20 carbon atoms, such as of butyloxy, pentyloxy, hexyloxy, heptyloxy, ocyloxy, nonyloxy, decyloxy, undecyloxy, dodecyloxy, tridecyloxy, tetradecyloxy, pentadecyloxy, hexadecyloxy, heptadecyloxy, octadecyloxy, nonadecyloxy, or eicosanyloxy; aryl with from about 6 to about 48 carbon atoms, from about 6 to about 36 carbon atoms, or from about 8 to about 24 carbon atoms, such as phenyl, substituted phenyls, and the like.

The novel polymers, such as the ethynylene heteroacene polymers, in embodiments are soluble or substantially soluble in common coating solvents, for example, in embodiments they possess a solubility of at least about 0.1 percent by weight, and more specifically, from about 0.5 percent to about 95 percent by weight in such solvents as methylene chloride, 1,2-dichloroethane, tetrahydrofuran, toluene, xylene, mesitylene, chlorobenzene, dichlorobenzene, and the like. Moreover, the ethynylene heteroacene polymers of the present disclosure in embodiments, when fabricated as semiconductor channel layers in TFT devices, provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the ethynylene heteroacene polymers when fabricated from solutions as thin films of, for example, from about 10 nanometers to about 500 nanometers or from about 100 to about 300 nanometers in thickness are more stable in ambient conditions than similar devices fabricated from heteroacenes or acenes. When unprotected, electronic devices containing the aforementioned ethynylene heteroacene polymers and devices are generally stable for a number of weeks rather than days or hours as is the situation with poly(3-alkylthiophene-2,5-diyl) after exposure to ambient oxygen, thus the devices fabricated from the ethynylene heteroacene polymers in embodiments of the present disclosure can provide higher current on/off ratios, and their performance characteristics do not substantially change as rapidly as that of heteroacenes or poly(3-alkylthiophene-2,5-diyl) when no rigorous procedural precautions have been taken to exclude ambient oxygen during material preparation, device fabrication, and evaluation. The ethynylene heteroacene polymers stability of the present disclosure in embodiments against oxidative doping, particularly for low cost device manufacturing, do not usually have to be handled in an inert atmosphere and the processes thereof are, therefore, simpler and more cost effective, and the fabrication thereof can be applied to large scale production processes.

The preparation polymers of the present disclosure can be generally accomplished as illustrated herein. More specifically, the process for the preparation of the ethynylene heteroacene polymers are represented by reaction Scheme 1.

Scheme 1-Synthesis of Ethynyl Heteroacene Monomers and Polymers

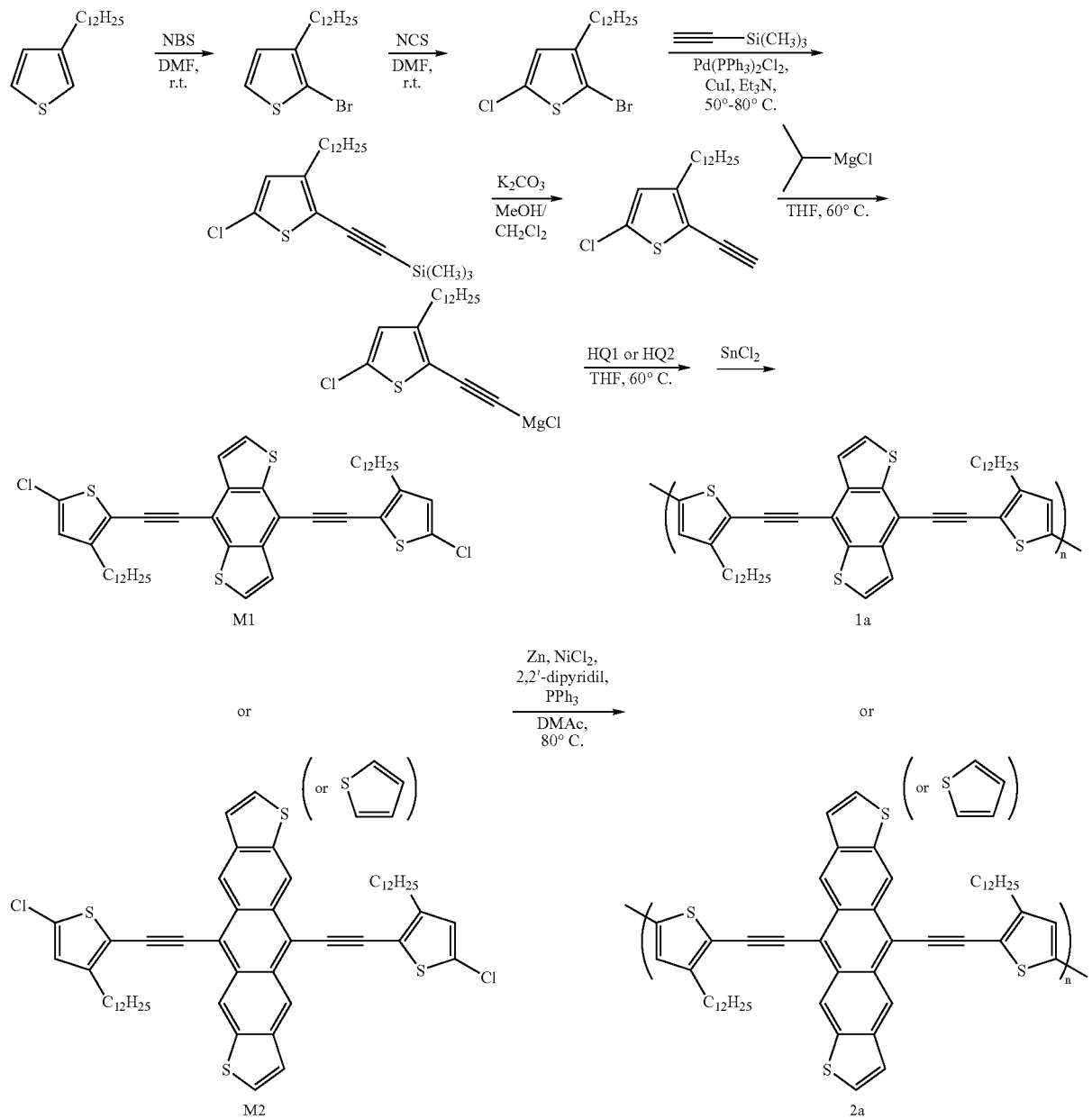

First, generally 2-bromo-5-chloro-3-dodecylthiophene can be prepared by brominating 3-dodecylthiophene with 1 molar equivalent of N-bromosuccinimide (NBS) in N,N-dimethylformamide (DMF) at room temperature (rt) (rt or room temperature refers to a temperature of from about 22° C. to about 25° C.). Thereafter, chlorination of 2-bromo-3-dodecylthiophene with 1 molar equivalent of N-chlorosuccinimide (NCS) at room temperature generates 2-bromo-5-chloro-3-odecylthiophene. Subsequently, 2-bromo-5-chloro-3-dodecylthiophene is reacted with trimethylsilylacetylene in the presence of dichlorobis(triphenylphosphine)palladium (II) for a suitable time like 24 hours, (Pd(PPh$_3$)$_2$Cl$_2$) and copper(I) iodide (CuI) in triethylamine (Et$_3$N) at elevated temperatures like 50° C. and at elevated temperatures like 80° C. for a suitable time like 3 hours under argon to form 5-chloro-3-dodecyl-2-(trimethylsilyl)ethynylthiophene. 5-Chloro-3-dodecyl-2-(trimethylsilyl)ethynylthiophene is then stirred in a mixture of methanol/dichloromethane (½, v/v) in the presence of 10 percent mol of potassium carbonate at room temperature for a suitable time like 1 hour to produce 5-chloro-3-dodecyl-2-ethynylthiophene. 5-Chloro-3-dodecyl-2-ethynylthiophene is further reacted with isopropylmagnesium chloride and then with benzo[1,2-b:4,5-b']dithiophene (HQ1) (HQ1 is prepared according to Beimling, P., et al, *Chem. Ber.* 1986, 119, 3198, the disclosure of which is totally incorporated herein by reference), or with anthra[2,3-b:6,7-b']dithiophene-5,11-dione/anthra[2,3-b:7,6-b']dithiophene-5,11-dione (HQ2, a mixture of trans and cis isomers) (HQ2 is prepared according to De la Cruz, P., et al, *J. Org. Chem.* 1992, 57, 6192, the disclosure of which is totally incorporated herein by reference), at elevated temperatures like 50° C. in tetrahydrofuran (THF) under argon, followed by reduction with tin (II) chloride ($SnCl_2$) solution in 10 percent HCl at elevated temperatures like 50° C. The resultant 4,8-bis((5-chloro-3-dodecylthienyl)ethynyl)benzo[1,2-b:4,5-b']dithiophene ($M_1$) and 5,11-bis((5-chloro-3-dodecylthienyl)ethynyl)anthra[2,3-b:6,7-b']dithiophene/5,11-bis((5-chloro-3-dodecylthienyl)ethynyl)anthra[2,3-b:7,6-b'] dithiophene ($M_2$, which can be a mixture of trans and cis isomers) are polymerized using zinc in the presence of nickel (II) chloride ($NiCl_2$), 2,2'-dipyridil, triphenylphosphine ($PPh_3$) in N,N-dimethylacetamide (DMAc) at elevated temperatures like 80° C. for a suitable time like 48 hours. Poly (4,8-bis(3-dodecylthienylethynyl)benzo[1,2-b:4,5-b']dithiophene) (1a) and poly(5,11-bis(3-dodecylthienylethynyl)anthra[2,3-b:6,7-b']dithiophene/5,11-bis(3-dodecylthienylethynyl)anthra[2,3-b:7,6-b']dithiophene) (2a) are obtained as products.

Aspects of the present disclosure relate to an electronic device containing the ethynylene heteroacene polymers illustrated herein; a device which is a thin film transistor comprised of a substrate, a gate electrode, a gate dielectric layer, a source electrode and a drain electrode, and in contact with the source/drain electrodes and the gate dielectric layer, a semiconductor layer comprised of the ethynylene heteroacene polymers illustrated herein; polymers and devices wherein the Formula I heteroatom containing groups are known and include, for example, polyethers, trialkylsilyls, heteroaryls, and the like; and more specifically, thienyl, furyl and pyridiaryl; the hetero component can be selected from a number of known atoms like sulfur, oxygen, nitrogen, silicon, selenium, and the like. Examples of heteroatoms or heteroatom containing components, including heteroaryls, are CN, thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, isomeric forms thereof, and mixtures thereof; an electronic device comprising a semiconductive material of Formula or structure (I)

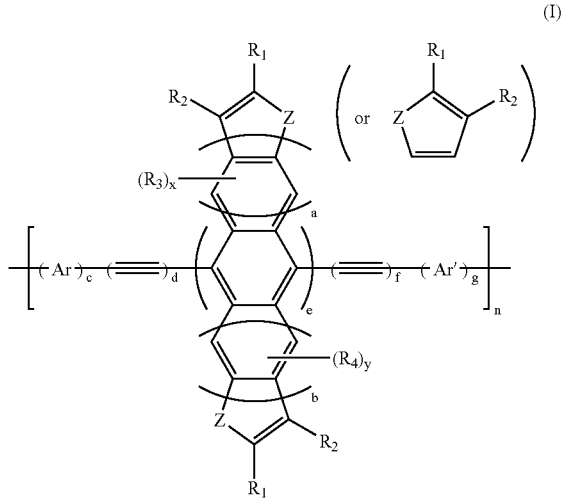

(I)

wherein each or at least one $R_1$, $R_2$, $R_3$ and $R_4$ is independently hydrogen (H), a heteroatom containing group, a suitable hydrocarbon, or a halogen; Ar and Ar' each independently represents an aromatic moiety; x, y, a, b, c, d, e, f and g represent the number of groups or rings, respectively; Z represents sulfur, oxygen, selenium, or NR''' wherein R''' is hydrogen, alkyl, or aryl; and n represents the number of repeating units; a device wherein Ar and Ar' are independently selected from the group consisting of the following structural units nonsubstituted or also substituted with a suitable hydrocarbon, a heteroatom containing group, or a halogen

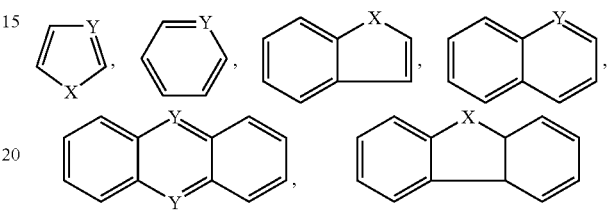

wherein X is selected from the group consisting of C(R'R''), O, S, Se, NR, and Si(R'R''), and wherein R, R', and R'' are independently selected from the group consisting of at least one of hydrogen, alkyl, and aryl; and Y is a carbon atom or a nitrogen atom; a thin film transistor comprised of a substrate, a gate electrode, a gate dielectric layer, a source electrode and a drain electrode, and in contact with the source/drain electrodes and the gate dielectric layer a semiconductor layer polymer of the formula/structure

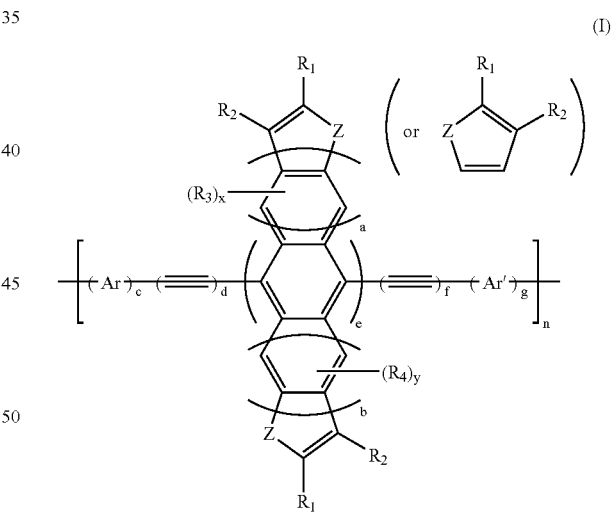

(I)

wherein at least one or each $R_1$, $R_2$, $R_3$ and $R_4$ is independently hydrogen (H), a heteroatom containing group, a suitable hydrocarbon, or a halogen; Ar and Ar' each independently represents an aromatic moiety; x, y, a, b, c, d, e, f and g represent the number of groups or rings, respectively; Z represents sulfur, oxygen, selenium, or NR''' wherein R''' is hydrogen, alkyl, or aryl; and n represents the number of repeating units; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; said gate, source and drain electrodes are each comprised of gold; and the gate dielectric layer is comprised of the organic polymer poly(methacrylate) or poly(vinyl phenol); a device wherein the ethynylene heteroacene layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; and device or devices include electronic devices such as TFTs.

DETAILED DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14, on top of which layer 14 two metal contacts, 20 and 22 (source and drain electrodes), are deposited. Over and between the metal contacts 20 and 22 is the poly(4,8-bis(3-dodecylthienylethynyl)benzo[1,2-b:4,5-b']dithiophene) (1a) layer 12. The gate electrode can be included in the substrate, in the dielectric layer, and the like throughout.

Figure 2:
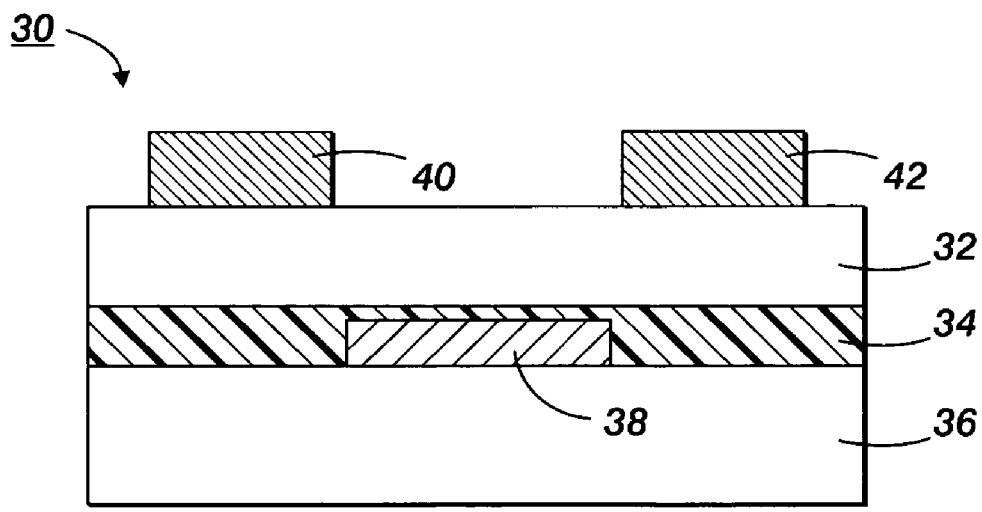

FIG. 2 schematically illustrates another TFT configuration 30 comprised of a substrate 36, a gate electrode 38, a source electrode 40, and a drain electrode 42, an insulating dielectric layer 34, and the ethynylene heteroacene semiconductor layer 32, poly(4,8-bis(3-dodecylthienylethynyl)benzo[1,2-b:4,5-b']dithiophene) (1a); poly(5,11-bis(3-dodecylthienylethynyl)anthra[2,3-b:6,7-b']dithiophene/5,11-bis(3-dodecylthienylethynyl)anthra[2,3-b:7,6-b']dithiophene) (2a); or mixtures thereof.

Figure 3:
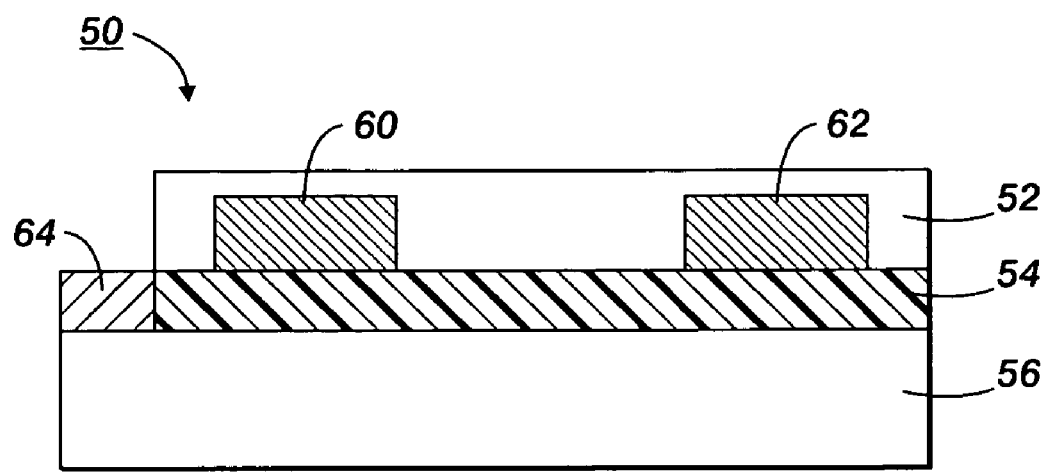

FIG. 3 schematically illustrates a further TFT configuration 50 comprised of a heavily n-doped silicon wafer 56, which can act as a gate electrode, a thermally grown silicon oxide dielectric layer 54, an ethynylene heteroacene semiconductor layer 52 of FIG. 2, on top of which are deposited a source electrode 60 and a drain electrode 62; and a gate electrode contact 64.

Figure 4:
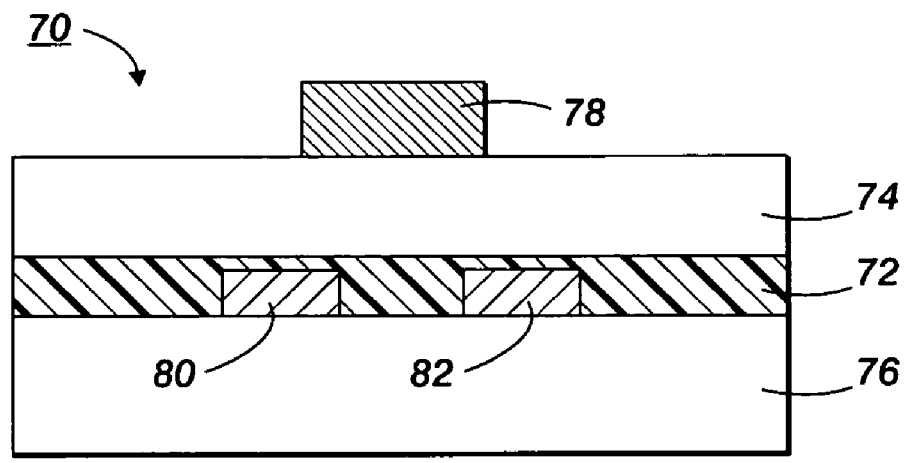

FIG. 4 schematically illustrates a TFT configuration 70 comprised of substrate 76, a gate electrode 78, a source electrode 80, a drain electrode 82, an ethynylene heteroacene polymer semiconductor layer 72 of FIG. 2, and an insulating dielectric layer 74.

In embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate, such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the ethynylene heteroacene polymers illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of the ethynylene heteroacene polymers of the present disclosure.

The gate electrode can be a thin metal film, a conducting polymer film, a conducting film generated from a conducting ink or paste, or the substrate itself (for example heavily doped silicon). Examples of gate electrode materials include but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions, or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials, such as gold, nickel, aluminum, platinum, conducting polymers, and conducting inks. Typical thickness of this layer is, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters, with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about −80 volts is applied to the gate electrode.

Other known materials not recited herein for the various components of the TFT devices of the present disclosure can also be selected in embodiments.

Although not desiring to be limited by theory, it is believed that the ethynyl groups function primarily to minimize or avoid instability because of exposure to oxygen and thus increase the oxidative stability of the ethynylene heteroacene polymers in solution under ambient conditions, and the alkyl and/or alkylaryl substituents or groups permit the solubility of these compounds in common solvents, such as ethylene chloride. Also, in embodiments alkyl groups that are unbranched could facilitate the formation of layered pi-stacks, a favorable form for charge transport properties.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising a semiconductive material of Formula (I):

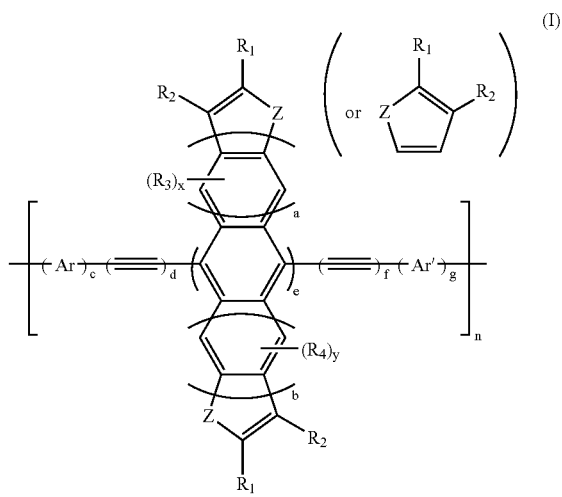

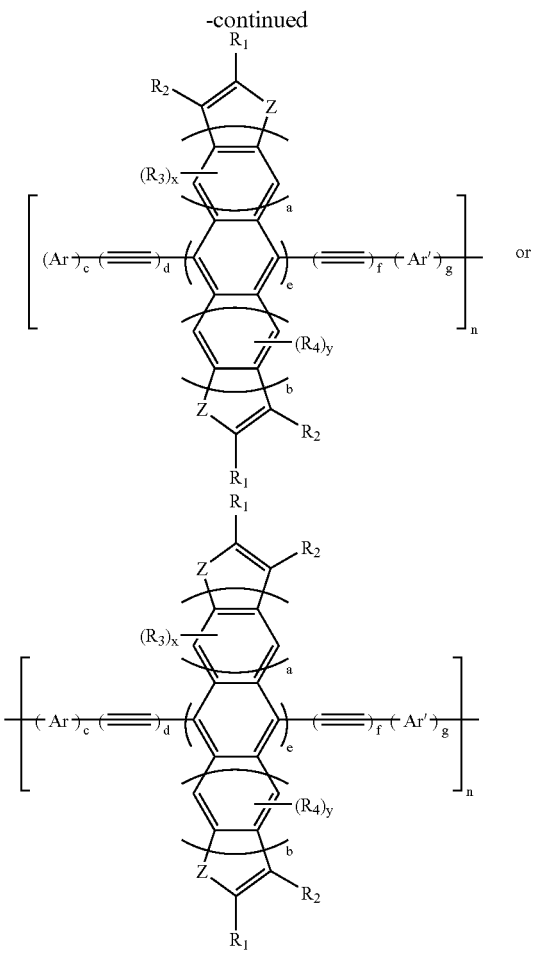

wherein each $R_1$, $R_2$, $R_3$ and $R_4$ are independently hydrogen, a heteroatom containing group, alkyl, aryl, substituted alkyl, substituted aryl, alkylaryl, alkoxy, substituted alkoxy, or halogen; Ar and Ar' each independently represents an aromatic moiety; Z represents sulfur, oxygen, selenium, or NR''' wherein R''' is hydrogen, alkyl, or aryl; x and y are independently from zero to about 12; a and b are independently from zero to about 4; c is from zero to about 10; d is from about 1 to about 10; e is from zero to about 4; f is from zero to about 6; g is from zero to about 10; and n represents the number of repeating units and is from about 2 to about 5,000.

2. A device in accordance with claim 1 wherein R''' is alkyl.

3. A device in accordance with claim 1 wherein Ar and Ar' are independently selected from the group consisting of the following structural units optionally substituted with a suitable hydrocarbon, a heteroatom containing group, or a halogen

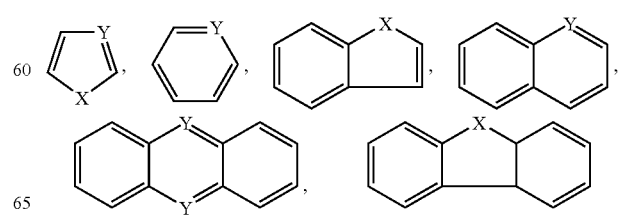

wherein X is selected from the group consisting of C(R'R"), O, S, Se, NR, and Si(R'R"), and wherein R, R', and R" are independently selected from the group consisting of at least one of hydrogen, alkyl, and aryl; and Y is a carbon atom or a nitrogen atom.

4. A device in accordance with claim 1 wherein at least one of $R_1$, $R_2$, $R_3$ and $R_4$ is hydrogen.

5. A device in accordance with claim 1 wherein at least one of $R_1$, $R_2$, $R_3$ and $R_4$ is alkyl or aryl.

6. A device in accordance with claim 1 wherein at least one of $R_1$, $R_2$ $R_3$ and $R_4$ is alkyl.

7. A device in accordance with claim 1 wherein at least one of $R_1$, $R_2$, $R_3$ and $R_4$ is aryl.

8. A device in accordance with claim 1 wherein at least one of $R_1$, $R_2$, $R_2$, $R_3$ and $R_4$ is alkoxy.

9. A device in accordance with claim 1 wherein at least one of $R_1$, $R_2$, $R_2$, $R_3$ and $R_4$ is halogen.

10. A device in accordance with claim 1 wherein at least one of $R_1$ and $R_2$ is nitro, cyano, dialkylamino, diarylamino, alkoxy, trialkylsilyl, or triarylsilyl.

11. A device in accordance with claim 1 wherein at least one of $R_1$, $R_2$, $R_2$, $R_3$ and $R_4$ is alkyl with from about 1 to about 30 carbon atoms.

12. A device in accordance with claim 1 wherein at least one of $R_1$, $R_2$, $R_2$, $R_3$ and $R_4$ is aryl with from about 6 to about 48 carbon atoms.

13. A device in accordance with claim 1 wherein at least one of $R_1$, $R_2$, $R_2$, $R_3$ and $R_4$ is alkoxy with from about 1 to about 30 carbon atoms.

14. A device in accordance with claim 1 wherein at least one of $R_1$, $R_2$, $R_2$, $R_3$ and $R_4$ is chloride, bromide, fluoride, or bromide.

15. A device in accordance with claim 1 wherein said heteroatom containing group contains from zero to about 36 carbon atoms.

16. A device in accordance with claim 1 wherein Z is sulfur or oxygen.

17. A device in accordance with claim 1 wherein Z is NR'" wherein R'" is aryl or alkyl containing from about 1 to about 25 carbon atoms.

18. A device in accordance with claim 1 wherein each x and y independently represents a number of from zero to about 4.

19. A device in accordance with claim 1 wherein a and b each independently represent a number of from zero to about 4, and wherein the sum of a and b is from zero to about 6.

20. A device in accordance with claim 1 wherein a and b each independently represent a number of from zero to about 2, and wherein the sum of a and b is from zero to about 4.

21. A device in accordance with claim 1 wherein c and f each independently represents a number of from zero to about 6, and wherein the sum of c and f is from zero to about 6.

22. A device in accordance with claim 1 wherein d and e each independently represent a number of from zero to about 4, and wherein the sum of d and e is from 1 to about 4.

23. A device in accordance with claim 1 wherein d and f each independently represent the number of from zero to about 2, and wherein the sum of d and f is from 1 to about 4.

24. A device in accordance with claim 1 wherein e is 1.

25. A device in accordance with claim 1 wherein n represents a number of from about 10 to about 100.

26. A device in accordance with claim 1 wherein n represents a number of repeating units from about 20 to about 100.

27. A thin film transistor comprised of a substrate, a gate electrode, a gate dielectric layer, a source electrode and a drain electrode, and in contact with the source/drain electrodes and the gate dielectric layer a semiconductor layer polymer of Formula (I):

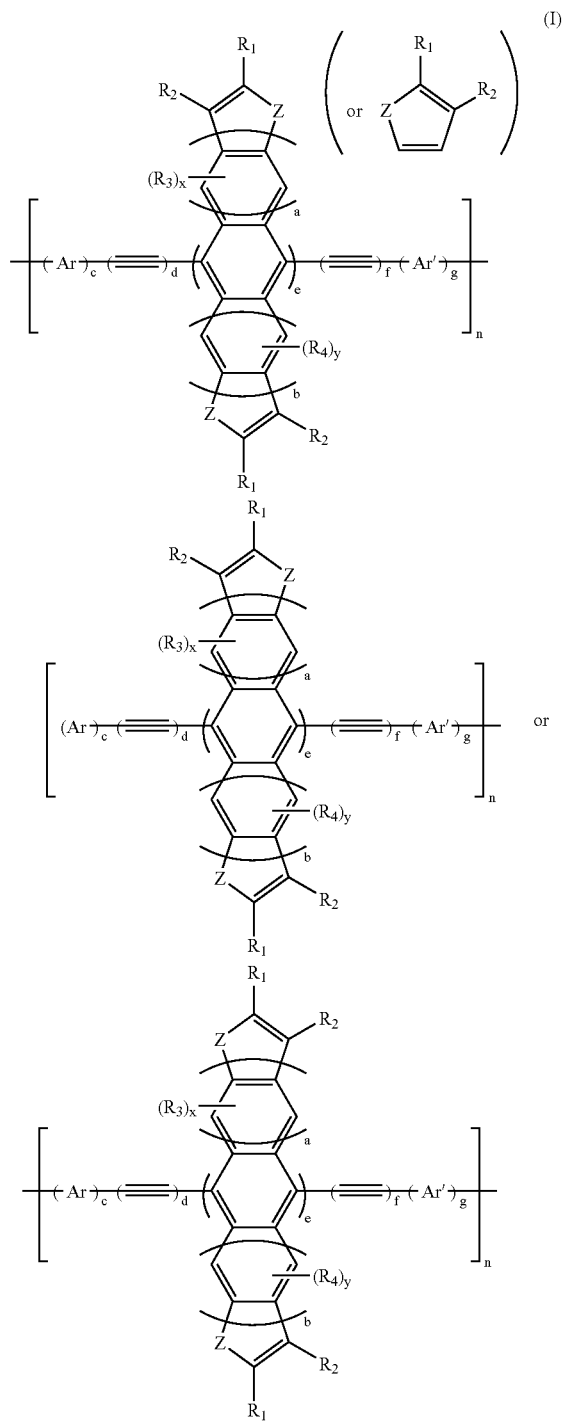

wherein each $R_1$, $R_2$, $R_3$ and $R_4$ is independently hydrogen, a heteroatom containing group, alkyl, aryl, substituted alkyl, substituted aryl, alkylaryl, alkoxy, substituted alkoxy, or halogen; Ar and Ar' each independently represents an aromatic moiety; Z represents sulfur, oxygen, selenium, or NR'" wherein R'" is hydrogen, alkyl, or aryl; x and y are independently from zero to about 12; a and b are independently from zero to about 4, c is from zero to about 10; d is from about 1 to about 10; e is from zero to about 4; f is from zero to about 6; g is from zero to about 10; and n represents the number of repeating units and is from about 2 to about 5,000.

28. A device in accordance with claim 27 wherein at least one of $R_1$, $R_2$, $R_3$ and $R_4$ is alkyl having from 4 to 20 carbon atoms.

29. A device in accordance with claim 27 wherein at least one of $R_1$, $R_2$, $R_3$ and $R_4$ is phenyl, tolyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl.

30. A device in accordance with claim 27 wherein at least one of $R_1$, $R_2$, $R_3$ and $R_4$ is alkoxy having from 1 to 20 carbon atoms, fluorine, chlorine, bromine, or iodine.

31. A device in accordance with claim 27 wherein said substrate is a plastic sheet of a polyester, a polycarbonate, or a polyimide; said gates, sources, and drain electrodes are each independently comprised of silver, gold, nickel, aluminum, chromium, platinum, or indium titanium oxide, or a conductive polymer; said gate dielectric layer is comprised of inorganic nitrides or oxides, or organic polymers, silicon nitride, silicon oxide; and wherein said semiconductor layer polymer is deposited by solution processes of spin coating, stamp printing, screen printing, or jet printing.

32. A thin film transistor in accordance with claim 27 wherein the field effect mobility is at least about 0.02 cm$^2$/V.sec, and the current on/off ratio is at least 10$^4$; wherein the field effect mobility is at least 0.05 cm$^2$/V.sec, and the current on/off ratio is equal to or greater than about 10$^5$; or wherein the field effect mobility is at least 0.1 cm$^2$/V.sec, and the current on/off ratio is equal to or greater than about 10$^6$.

33. A device in accordance with claim 27 wherein at least one of $R_1$, $R_2$, $R_3$ and $R_4$ is alkyl, aryl, substituted alkyl, substituted aryl, alkoxy or substituted alkoxy.

34. A device in accordance with claim 27 wherein the semiconductor layer polymer is poly(4,8-bis(3-dodecylthienylethynyl)benzo[1,2-b:4,5-b']dithiophene) (1a); poly(5,11-bis(3-dodecylthienylethynyl)anthra[2,3-b:6,7-b']dithiophene/5,11-bis(3-dodecylthienylethynyl)anthra[2,3-b:7,6-b']dithiophene) (2a), or mixtures thereof.

35. A device in accordance with claim 27 wherein the semiconductor layer polymer is an ethynylene heteroacene polymer according to one of the following formulas:

(1)

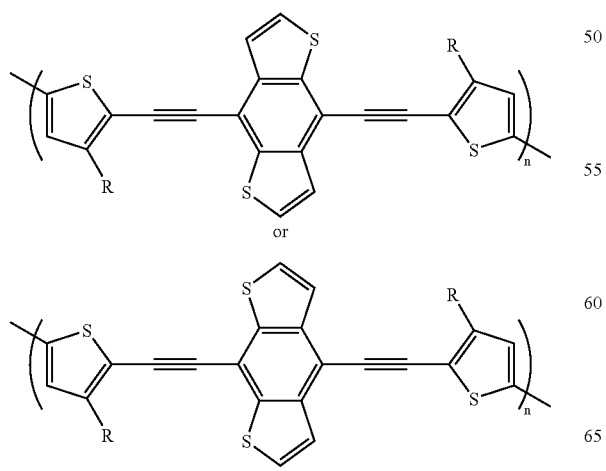

or

-continued (2)

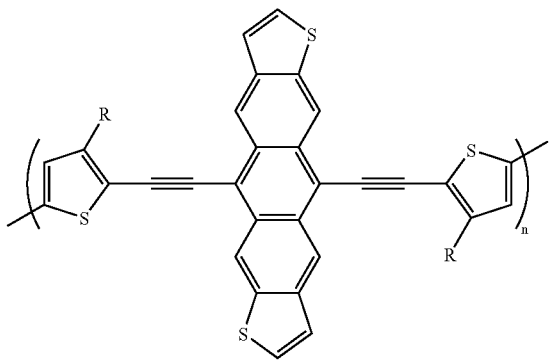

or

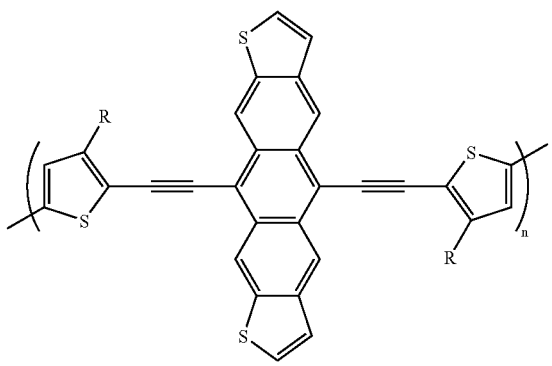

(3)

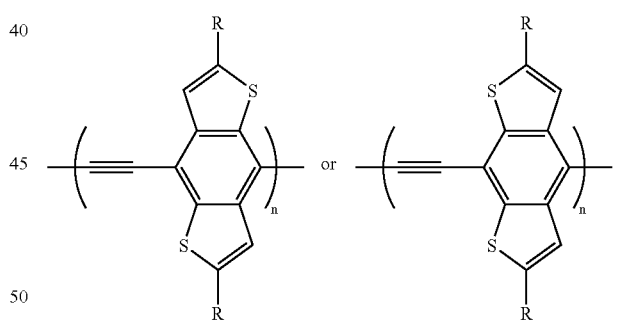

(4)

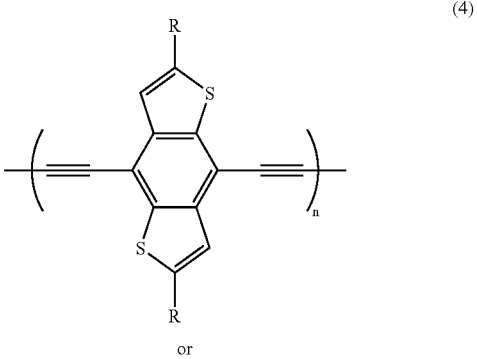

or

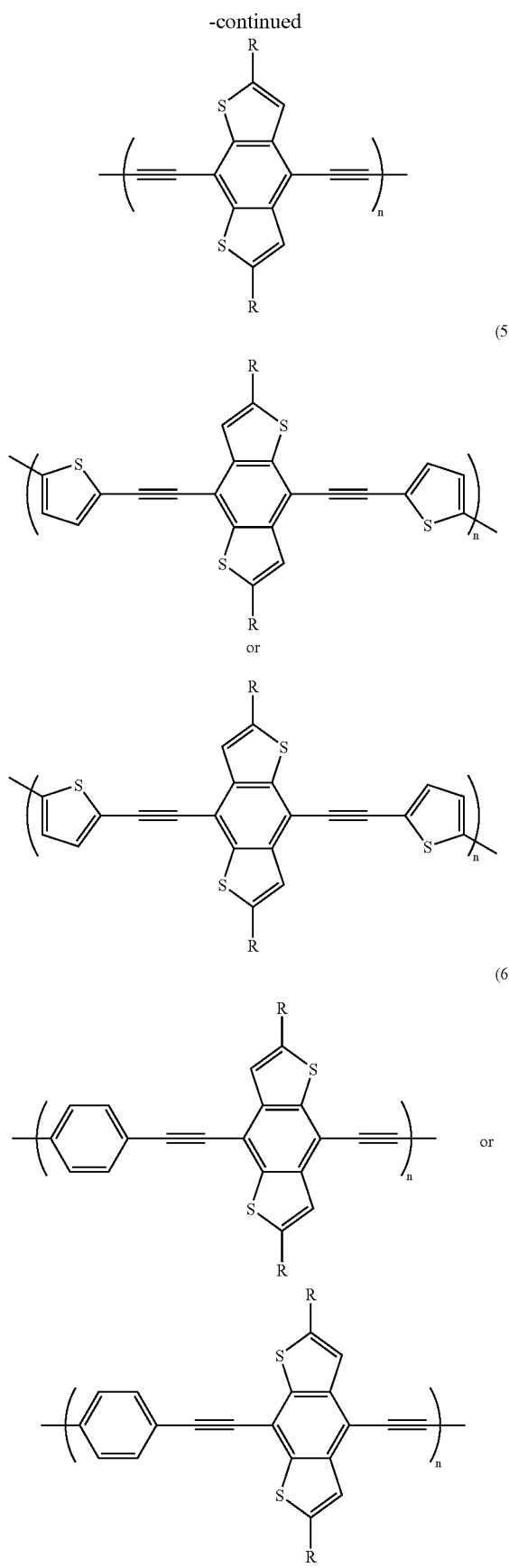
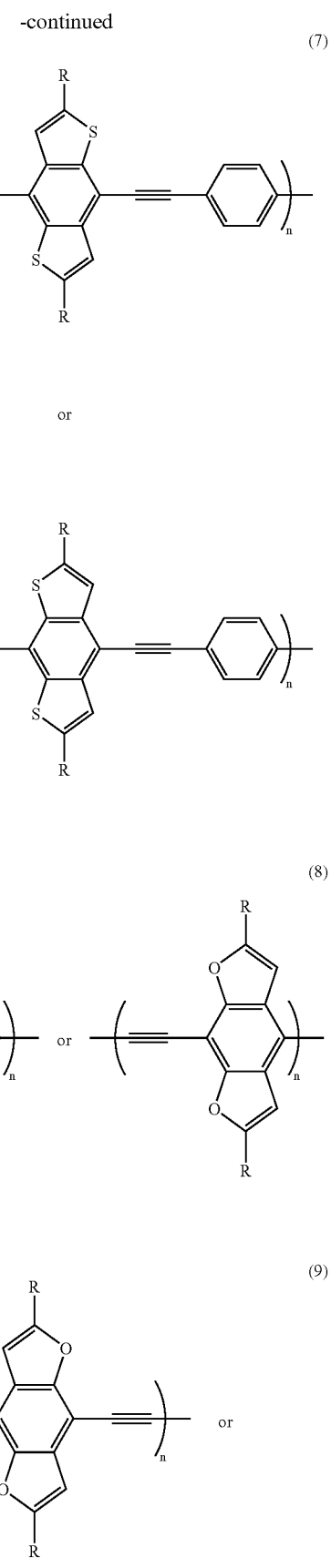

-continued
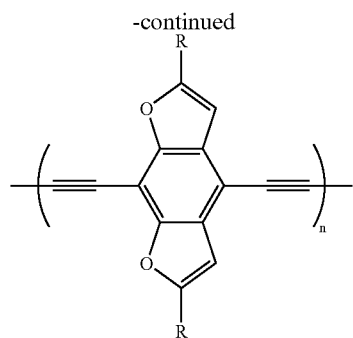
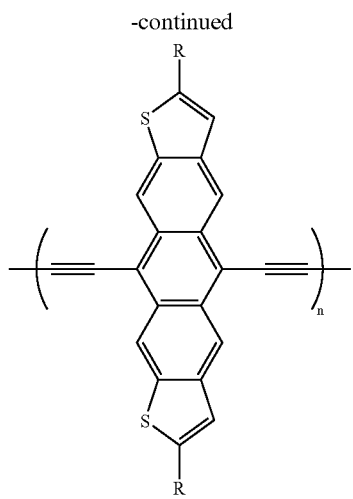
(10)
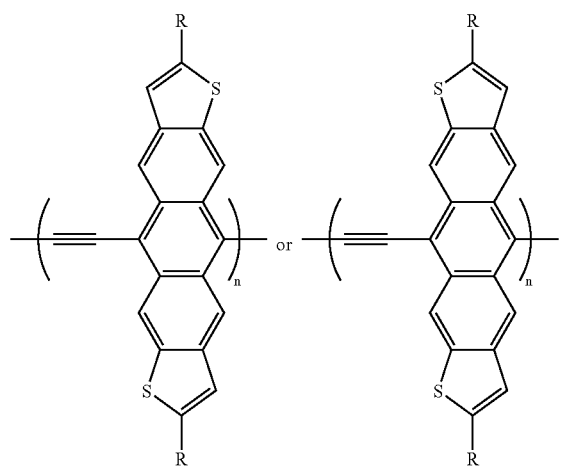
(12)
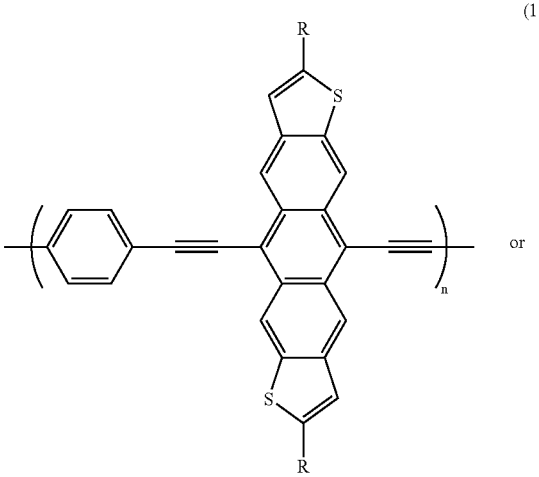
(11)
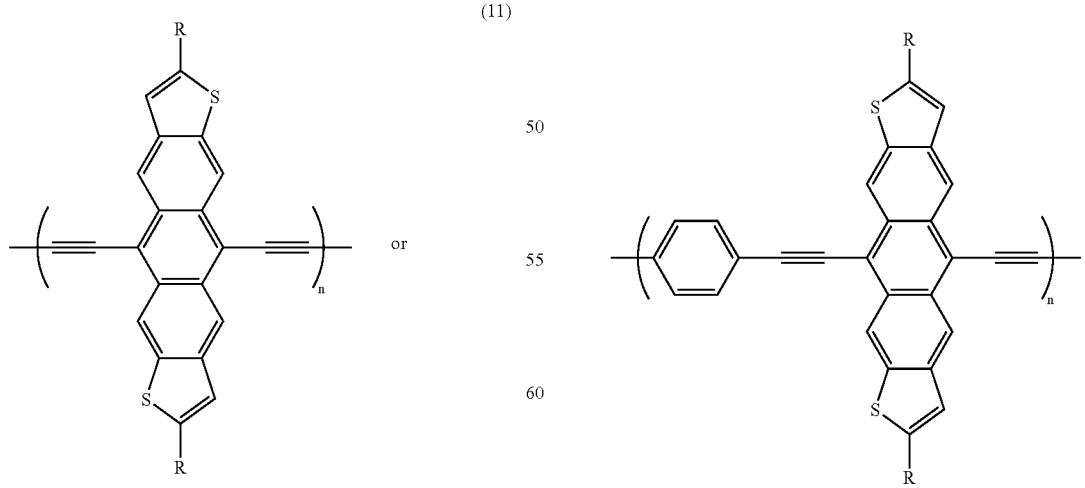

36. A polymer of Formula(I):

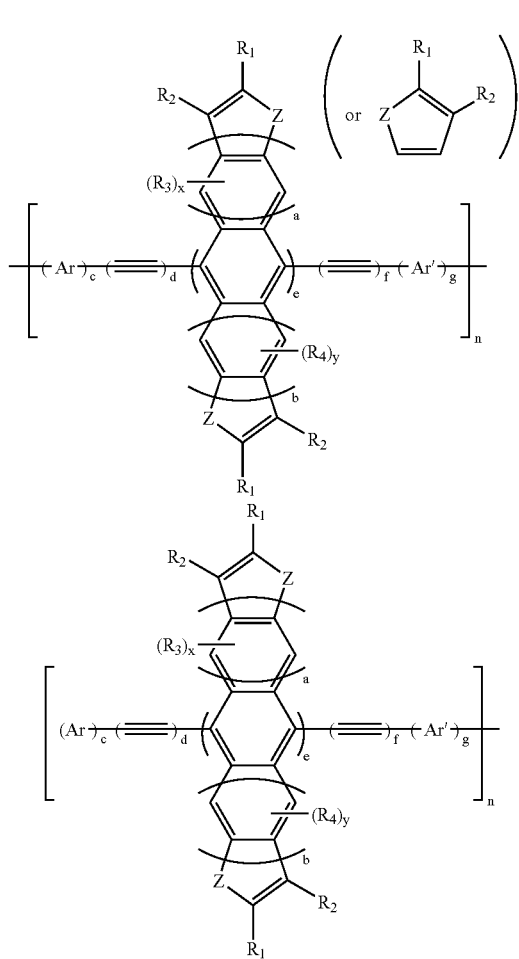
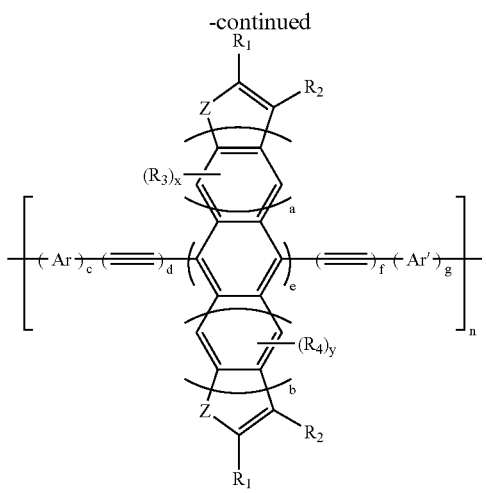

wherein each $R_1$, $R_2$, $R_3$ and $R_4$ is independently hydrogen, a heteroatom containing group, alkyl, aryl, substituted alkyl, substituted aryl, alkylaryl, alkoxy, substituted alkoxy, or halogen; Ar and Ar' each independently represents an aromatic moiety; Z represents sulfur, oxygen, selenium, or NR''' wherein R''' is hydrogen, alkyl, or aryl; x and y are independently from zero to about 12; a and b are independently from zero to about 4; c is from zero to about 10; d is from about 1 to about 10; e is from zero to about 4; f is from zero to about 6; g is from zero to about 10; and n represents the number of repeating units and is from about 2 to about 5,000.

* * * * *

UNITED STATES PATENT AND TRADEMARK OFFICE
CERTIFICATE OF CORRECTION

PATENT NO. : 7,557,370 B2
APPLICATION NO. : 11/399064
DATED : July 7, 2009
INVENTOR(S) : Yuning Li et al.

Page 1 of 1

It is certified that error appears in the above-identified patent and that said Letters Patent is hereby corrected as shown below:

In the Specification:

Column 1, line 10, after "Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*